(12) United States Patent
Yoshioka

(10) Patent No.: US 12,422,489 B2
(45) Date of Patent: Sep. 23, 2025

(54) DETERMINATION METHOD, DETERMINATION DEVICE, AND PROGRAM

(71) Applicant: GS Yuasa International Ltd., Kyoto (JP)

(72) Inventor: Yusuke Yoshioka, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 155 days.

(21) Appl. No.: 18/560,835

(22) PCT Filed: Mar. 7, 2022

(86) PCT No.: PCT/JP2022/009664
§ 371 (c)(1),
(2) Date: Nov. 14, 2023

(87) PCT Pub. No.: WO2022/244391
PCT Pub. Date: Nov. 24, 2022

(65) Prior Publication Data
US 2024/0255579 A1    Aug. 1, 2024

(30) Foreign Application Priority Data

May 18, 2021    (JP) ................................ 2021-084084

(51) Int. Cl.
*G01R 31/3835*    (2019.01)
*B60R 16/033*    (2006.01)
(Continued)

(52) U.S. Cl.
CPC ........ *G01R 31/3835* (2019.01); *H01M 10/44* (2013.01); *H01M 10/48* (2013.01);
(Continued)

(58) Field of Classification Search
CPC .. G01R 31/3835; H01M 10/44; H01M 10/48; H01M 2220/20; H02J 7/0047; B60R 16/033
(Continued)

(56) References Cited

U.S. PATENT DOCUMENTS 10,444,290 B2 * 10/2019 Kawamura ............. B60L 58/20
2010/0240419 A1    9/2010 Horino
(Continued)

FOREIGN PATENT DOCUMENTS

| JP | S53-103128 A | 9/1978 |
|----|----|----|
| JP | 2008-096166 A | 4/2008 |

(Continued)

OTHER PUBLICATIONS

International Search Report and Written Opinion for International Application No. PCT/JP2022/009664, dated Apr. 26, 2022, (9 pages), Japan Patent Office, Tokyo, Japan.

*Primary Examiner* — Giovanni Astacio-Oquendo
*Assistant Examiner* — Trung Q Nguyen
(74) *Attorney, Agent, or Firm* — Buchalter, a Professional Corporation

(57) ABSTRACT

A determination method is provided, which determines a charging reception performance and/or a discharging performance of an energy storage apparatus. The method includes: acquiring an open circuit voltage of the energy storage apparatus after electricity is supplied with an assumed electricity supply pattern based on a charging state of the energy storage apparatus at a point of time of determination; acquiring a change in voltage attributed to the assumed electricity supply pattern after electricity is supplied with the assumed electricity supply pattern based on an internal resistance, a charging state and a temperature at the point of time of determination; acquiring a change in
(Continued)

voltage attributed to electricity supply history before the electricity is supplied with the assumed electricity supply pattern based on a polarization component before the electricity is supplied with the assumed electricity supply pattern.

9 Claims, 8 Drawing Sheets

(51) Int. Cl.
   *H01M 10/44* (2006.01)
   *H01M 10/48* (2006.01)
   *H02J 7/00* (2006.01)
(52) U.S. Cl.
   CPC .......... *H02J 7/0047* (2013.01); *B60R 16/033* (2013.01); *H01M 2220/20* (2013.01)
(58) Field of Classification Search
   USPC .............................. 324/500, 600, 76.11, 426
   See application file for complete search history.

(56) References Cited

U.S. PATENT DOCUMENTS

| | | |
|---|---|---|
| 2015/0160301 A1 | 6/2015 | Kusano et al. |
| 2015/0355288 A1 | 12/2015 | Yokoyama et al. |
| 2016/0187429 A1 | 6/2016 | Kawai et al. |
| 2019/0004115 A1 | 1/2019 | Nakamura et al. |
| 2019/0288520 A1* | 9/2019 | Abdel-Monem .... G01R 31/392 |
| 2020/0298727 A1 | 9/2020 | Ukai et al. |
| 2021/0325469 A1* | 10/2021 | Torai .................... G01R 31/367 |

FOREIGN PATENT DOCUMENTS

| | | |
|---|---|---|
| JP | 2012-013472 A | 1/2012 |
| JP | 2013-092052 A | 5/2013 |
| JP | 2015-114135 A | 6/2015 |
| JP | 2016-126999 A | 7/2016 |
| JP | 2017-069011 A | 4/2017 |
| JP | 2018-041622 A | 3/2018 |
| JP | 2020-152139 A | 9/2020 |
| WO | WO-2007/114066 A1 | 10/2007 |
| WO | WO-2014/129025 A1 | 8/2014 |
| WO | WO-2017/130673 A1 | 8/2017 |

* cited by examiner

DETERMINATION METHOD, DETERMINATION DEVICE, AND PROGRAM

CROSS REFERENCE TO RELATED APPLICATIONS

This application is a National Stage Application, filed under 35 U.S.C. § 371, of International Application No. PCT/JP2022/009664, filed Mar. 7, 2022, which international application claims priority to and the benefit of Japanese Application No. 2021-084084, filed May 18, 2021; the contents of both of which as are hereby incorporated by reference in their entireties.

BACKGROUND

Technical Field

The present invention relates to a determination method, a determination device, and a program.

Description of Related Art

In recent years, the number and kinds of electronic devices mounted on vehicles have been increasing in order to improve safety performance of an automobile and a riding comfort that a driver feels. As a representative example, an electronic device for a start-stop function (idling stop function) for reducing a load on the environment and an electronic device for an automatic driving function are mounted on a vehicle. Along with such a tendency, there is an increasing need to detect a state of an energy storage apparatus for supplying electricity to an electronic device at an early stage and to predict whether or not the energy storage apparatus can supply electricity.

Patent document 1 discloses a battery control device capable of accurately calculating an amount of electricity that is chargeable to and dischargeable from a battery and an amount of electricity discharged from the battery. In the battery control device described in Patent document JP-A-2015-114135, charging-discharging allowable electricity is calculated by simulating the charging-discharging behavior of the storage battery by expressing the battery as an electrical equivalent circuit.

BRIEF SUMMARY

In the battery control device described in Patent Document 1, in order to estimate a present state of a battery, it is necessary to derive a differential equation from an equivalent circuit, and to perform arithmetic operation processing including an exponential function or sequential arithmetic operation processing of a capacity component. Accordingly, an arithmetic operation load is increased so that a high-performance computer is required. With the increase of an arithmetic operation load, there arises a concern that it is difficult to predict whether or not the supply of electricity can be performed within an appropriate updating period.

The present disclosure provides a determination method, a determination device, and a program capable of reducing an arithmetic processing load.

A determination method according to an aspect of the present disclosure determines a charging reception performance and/or a discharging performance of an energy storage apparatus. The determination method includes: acquiring an open circuit voltage of the energy storage apparatus after electricity is supplied in accordance with an assumed electricity supply pattern, the open circuit voltage being estimated based on a charging state of the energy storage apparatus at a point of time of determination; acquiring a change in voltage attributed to the assumed electricity supply pattern after electricity is supplied in accordance with the assumed electricity supply pattern, the change in voltage being estimated based on an internal resistance of the energy storage apparatus and a charging state and a temperature at the point of time of determination; acquiring a change in voltage attributed to electricity supply history before the electricity is supplied in accordance with the assumed electricity supply pattern, the change in voltage being estimated based on a polarization component of the energy storage apparatus before the electricity is supplied in accordance with the assumed electricity supply pattern; and determining whether or not it is possible to supply electricity to the energy storage apparatus in accordance with the assumed electricity supply pattern based on the acquired open circuit voltage, the change in voltage attributed to the assumed electricity supply pattern, and the change in voltage attributed to the electricity supply history.

According to the present disclosure, the determination method can reduce an arithmetic operation load.

BRIEF DESCRIPTION OF THE FIGURES

FIG. 1 is a block diagram illustrating the configurational example of an energy storage apparatus, a determination device and the like.

Figure 1:
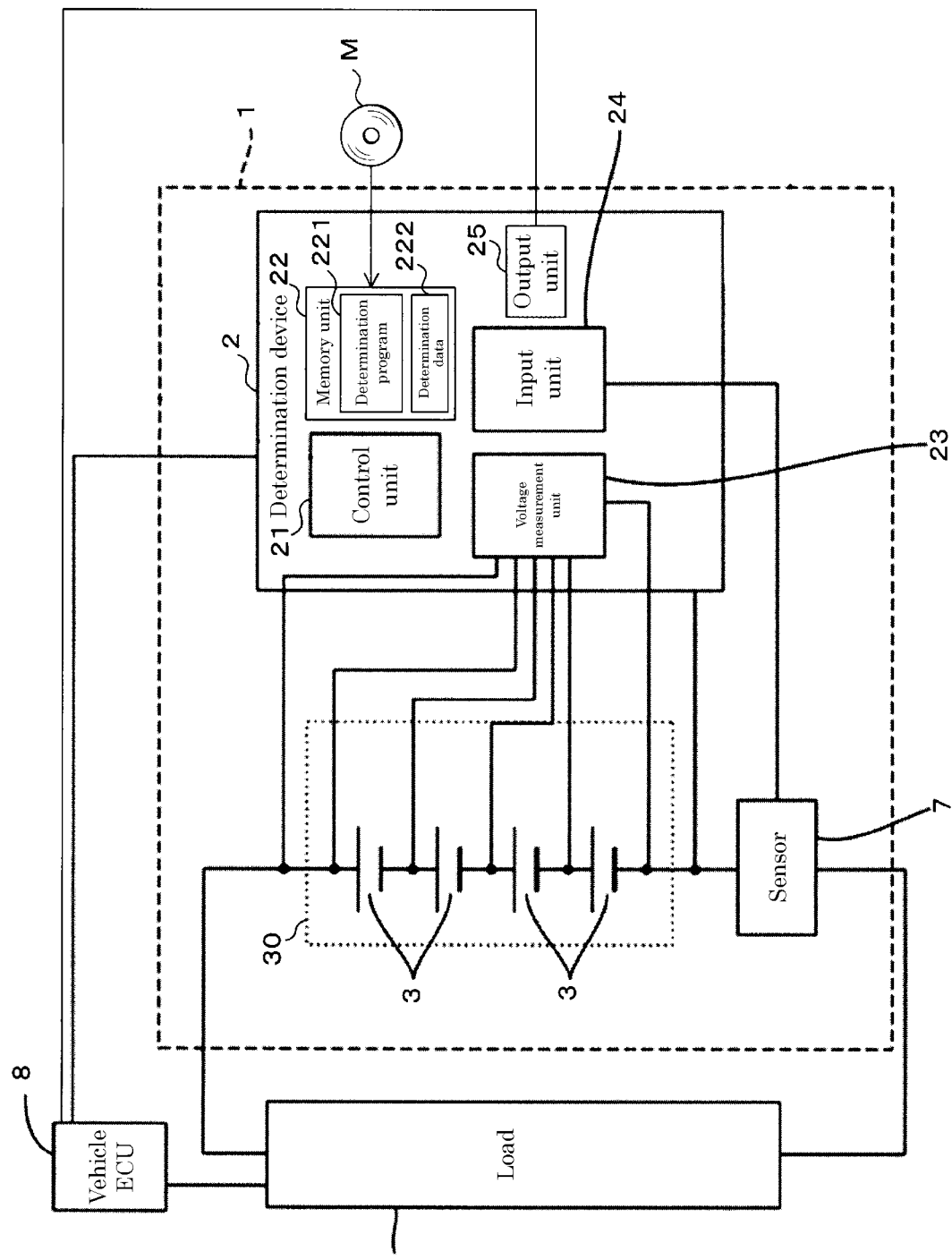

DETAILED DESCRIPTION OF VARIOUS EMBODIMENTS (1) A determination method determines a charging reception performance and/or a discharging performance of an energy storage apparatus.

The determination method includes: acquiring an open circuit voltage of the energy storage apparatus after electricity is supplied in an assumed electricity supply pattern, the open circuit voltage being estimated based on a charging state of the energy storage apparatus at a point of time of determination (see Vocv_p in FIG. 5);
    acquiring a change in voltage attributed to the assumed electricity supply pattern after electricity is supplied in accordance with the assumed electricity supply pattern (hereinafter simply referred to as "change in voltage attributed to assumed electricity supply pattern"), the change in voltage being estimated based on an internal resistance of the energy storage apparatus and a charging state and a temperature at the point of time of determination (see Vz0_p+Vz1_p in FIG. 5);
    acquiring a change in voltage attributed to electricity supply history before the electricity is supplied in accordance with the assumed electricity supply pattern the change in voltage being estimated based on a polarization component of the energy storage apparatus before the electricity is supplied in accordance with the assumed electricity supply pattern (hereinafter simply referred to as "a change in voltage attributed to electricity supply history" (see Vz1 in FIG. 5); and
    determining whether or not it is possible to supply electricity to the energy storage apparatus in accordance with the assumed electricity supply pattern based on the acquired open circuit voltage, the change in voltage attributed to the assumed electricity supply pattern, and the change in voltage attributed to the electricity supply history.

According to the above configuration, the voltage value in the energy storage apparatus after electricity is supplied in accordance with the assumed electricity supply pattern is estimated based on the open circuit voltage of the energy storage apparatus after electricity is supplied in accordance with the assumed electricity supply pattern, the change in voltage in accordance with the assumed electricity supply pattern, and the change in voltage attributed to the electricity supply history. In accordance with the estimation result, it is possible to determine whether or not the supply of electricity to the energy storage apparatus is possible in accordance with the assumed electricity supply pattern, that is, the charging reception performance and/or the discharging performance of the energy storage.

The assumed electricity supply pattern is determined according to a usage or an application of the energy storage apparatus. The assumed electricity supply pattern is, for example, a current pattern based on an amount of current consumption of various electronic devices mounted on a vehicle including an energy storage apparatus. In a case where it is determined that the supply of electricity is not possible in accordance with the assumed electricity supply pattern, the determination device notifies information corresponding to the determination result to the vehicle.

For example, in a case where a voltage of the energy storage apparatus is lowered due to the occurrence of an abnormality in a charging device in the vehicle so that the engine cannot be resumed, it is desirable to immediately disable (mask) an idling stop function. As another example, in a case where it is predicted that a degrading operation (requiring a time of substantially 10 seconds) at the time of completion of the automatic driving such as retreat to a side strip (or the side of a road) and stop cannot be completed, it is desirable to immediately finish the automatic driving function. In a case where it is predicted that an operating voltage goes beyond an operation voltage range of an electronic device or a discharge current exceeds a dischargeable current of the energy storage apparatus due to a transient discharging of electricity that is caused when a safety-related load (a steering wheel or a brake) used during traveling is turned on, it is desirable to shift the vehicle to a degrading operation at the time of finishing the automatic driving. For this purpose, it is necessary to determine whether or not the supply of electricity from the energy storage apparatus in accordance with an assumed electricity supply pattern is possible based on a present state of the energy storage apparatus. When the determination result that the supply of electricity is not possible is determined, the vehicle is immediately shifted to the degrading operation so that the safety of the driver can be secured.

As another example, in a case where the voltage of the energy storage apparatus is increased due to abnormality of the charging device in the vehicle, and it is predicted that an operating voltage goes beyond an operating voltage range of an electronic device or an operation current exceeds a charging reception current of the energy storage apparatus due to transient charging of electricity caused by turning off the safety-related load used during traveling, it is desirable to shift the operation to a degrading operation at the time of finishing the automatic driving. For this purpose, it is necessary to determine whether or not the power can be received in accordance with the assumed electricity supply pattern based on the present state of the energy storage apparatus. When the determination result that the reception of electricity cannot be performed is received, the vehicle can stop in such a manner that a regenerative brake is not used during the degrading operation.

As described above, during the operation of the energy storage apparatus, it is required to accurately determine whether or not to supply electricity in accordance with the assumed electricity supply pattern in a short time. Conventionally, a voltage behavior of an energy storage apparatus is simulated by expressing the energy storage apparatus as an electrical equivalent circuit model, and whether or not charging and discharging can be performed is determined.

In order to simulate a state (particularly, a polarization state) of an energy storage apparatus during the use of the vehicle, it is necessary to derive a differential equation from an equivalent circuit model, and to perform arithmetic operation processing including an exponential function or a sequential arithmetic operation processing of a capacity component.

On the other hand, in the determination method (1) described above, a change in voltage attributed to the electricity supply history before supply of electricity in accordance with the assumed electricity supply pattern is acquired. The electricity supply history before supply of electricity in accordance with the assumed electricity supply pattern is a history of charging or discharging or charging and discharging of the energy storage apparatus at a point of time before the point of time of determination (a present point of time at which the determination processing is performed). It is possible to predict a final voltage value that takes into account the past electricity supply history by adding or subtracting a change in voltage attributed to the electricity supply history to or from the predicted voltage value after electricity is supplied in accordance with an assumed electricity supply pattern.

According to this determination method, the charge-discharge capacity can be determined in a shorter time than the conventional method. Since both the charging reception performance and the discharging performance can be determined, a current to be supplied in both charging and discharging of the energy storage apparatus can be favorably controlled. By reducing the calculation processing, it is no more necessary to increase the specification of the determination device and hence, the cost can be reduced. Even in a case where sequential calculation is difficult due to, for example, a state where the electronic device (vehicle ECU) intermittently is shifted to a sleep mode, determination processing can be performed by this algorithm.

(2) In the determination method, a change in voltage attributed to the assumed electricity supply pattern may include a first voltage change ($Vz0\_p$ in FIG. 5) due to an ohmic internal resistance of the energy storage apparatus and a second voltage change ($Vz1\_p$ in FIG. 5) due to a non-ohmic internal resistance.

According to the above configuration, a change in voltage attributed to the assumed electricity supply pattern can be easily determined based on actual measurement data of the actual battery test and the like. The calculation load at the time of determination can be further reduced by obtaining and storing a change in voltage attributed to the assumed electricity supply pattern in advance.

(3) In the determination method, a change in voltage ($Vz1$ in FIG. 5) attributed to the electricity supply history may be obtained by subtracting an ohmic internal resistance ($Vz0$ in FIG. 5) of the energy storage apparatus before supply of electricity in accordance with the assumed electricity supply pattern from a polarization component ($Vz1+Vz0$ in FIG. 5) of the energy storage apparatus before supply of electricity in accordance with the assumed electricity supply pattern.

According to the above configuration, a change in voltage attributed to the electricity supply history can be calculated based on the polarization component of the energy storage apparatus and the ohmic internal resistance of the energy storage apparatus at the time of determination. Since the polarization component of the energy storage apparatus and the ohmic internal resistance of the energy storage apparatus can be easily calculated from measurement values such as a voltage, a current, and a temperature of the energy storage apparatus at the time of determination, a state of charge (SOC), and the like and hence, an arithmetic load can be reduced.

(4) In the determination method, whether or not the supply of electricity to the energy storage apparatus is possible in accordance with the assumed electricity supply pattern may be determined based on a voltage value obtained by adding or subtracting, according to an electricity supply direction at a point of time before supply of the electricity in accordance with the assumed electricity supply pattern, a change in voltage attributed to the electricity supply history to or from a change in voltage attributed to the open circuit voltage and the assumed electricity supply pattern.

According to the above configuration, a change in voltage attributed to the electricity supply history is added to or subtracted from a change in voltage attributed to the open circuit voltage and the assumed electricity supply pattern, that is, the voltage value that does not take into account the electricity supply history (see FIG. 4) according to the electricity supply direction in the electricity supply history before supply of electricity of the assumed electricity supply pattern. Accordingly, a change in voltage attributed to the electricity supply history can be suitably reflected on the determination.

(5) A determination device determines a charging reception performance and/or a discharging performance of an energy storage apparatus.

The determination device includes: a first acquisition unit configured to acquire an open circuit voltage of the energy storage apparatus after electricity is supplied in accordance with an assumed electricity supply pattern, the open circuit voltage being estimated based on a charging state of the energy storage apparatus at a point of time of determination; a second acquisition unit configured to acquire a change in voltage attributed to the assumed electricity supply pattern after the electricity is supplied in accordance with the assumed electricity supply pattern, the change in voltage being estimated based on an internal resistance of the energy storage apparatus and a charging state and a temperature at the point of time of determination; a third acquisition unit configured to acquire a change in voltage attributed to electricity supply history before electricity is supplied in accordance with the assumed electricity supply pattern, the change in voltage being estimated based on a polarization component of the energy storage apparatus before the electricity is supplied in accordance with the assumed electricity supply pattern; and a determination unit configured to determine whether or not the supply of electricity to the energy storage apparatus in accordance with the assumed electricity supply pattern is possible based on the acquired open circuit voltage, the change in voltage attributed to the assumed electricity supply pattern, and the change in voltage attributed to the electricity supply history.

(6) A program that causes a computer for determining a charging reception performance and/or a discharging performance of an energy storage apparatus to execute the steps of: acquiring an open circuit voltage of the energy storage apparatus after electricity is supplied in accordance with an assumed electricity supply pattern, the open circuit voltage being estimated based on a charging state of the energy storage apparatus at a point of time of determination; acquiring a change in voltage attributed to the assumed electricity supply pattern after the electricity is supplied in accordance with the assumed electricity supply pattern, the change in voltage being estimated based on an internal resistance of the energy storage apparatus and a charging state and a temperature at the point of time of determination; acquiring a change in voltage attributed to electricity supply history before electricity is supplied in accordance with the assumed electricity supply pattern, the change in voltage being estimated based on a polarization component of the energy storage apparatus before the electricity is supplied in accordance with the assumed electricity supply pattern; and determining whether or not the supply of electricity to the energy storage apparatus in accordance with the assumed electricity supply pattern is possible based on the acquired open circuit voltage, the change in voltage attributed to the assumed electricity supply pattern, and the change in voltage attributed to the electricity supply history.

Hereinafter, the present disclosure is specifically described with reference to the drawings that illustrate embodiments of the present disclosure.

FIG. 1 is a block diagram illustrating a configurational example of an energy storage apparatus 1 that includes a determination device 2 according to the present embodiment. In the present embodiment, the determination device 2 is mounted on a vehicle that includes a plurality of electronic devices. The determination device 2 is, for example, a battery management system (BMS). The determination device 2 acquires measurement data including a voltage value of the energy storage apparatus 1 and a current value of a current that flows in the energy storage apparatus 1, and determines whether or not the supply of electricity to the energy storage apparatus 1 is possible based on the acquired measurement data.

The energy storage apparatus 1 is connected to a vehicle electronic control unit (ECU) 8, a starter motor for starting an engine, and a load 9 such as an electrical component. The energy storage apparatus 1 includes an assembled battery 30 formed of a plurality of energy storage devices 3. The energy storage device 3 may be a secondary battery cell such as a lithium ion battery. In a case where the starter motor functions as a generator, the energy storage apparatus 1 is charged with electricity (regenerative electricity) supplied from the starter motor. In a case where the starter motor functions as a power source, the energy storage apparatus 1 supplies electricity to the starter motor and other electronic devices.

The determination device 2 includes a control unit 21, a memory unit 22, a voltage measurement unit 23, an input unit 24, an output unit 25 and the like.

The control unit 21 is an arithmetic operation circuit that includes a central processing unit (CPU), a read only memory (ROM), a random access memory (RAM) and the like. The CPU that the control unit 21 includes executes various computer programs stored in the ROM and the memory unit 22, and makes the entire device function as the determination device of the present disclosure by controlling the operations of the respective hardware described above. The control unit 21 may include functions of: a timer that measures an elapsed time from a point of time that a measurement start command is given to a point of time that a measurement finishing command is given; a counter that counts the number, a clock that outputs information on date and time and the like.

The memory unit 22 is a nonvolatile memory device such as a flash memory. Various computer programs and data are stored in the memory unit 22. The computer program stored in the memory unit 22 includes a determination program 221 for determining whether or not the supply of electricity to the energy storage apparatus 1 is possible. The data stored in the memory unit 22 includes determination data 222 used in the determination program 221. For example, an assumed electricity supply pattern corresponding to the energy storage apparatus 1, an equivalent circuit model of the energy storage apparatus 1 used in the simulation, and the like are stored in the determination data 222. The assumed electricity supply pattern includes an electricity supply current value, an electricity supply time and the like relating to charging or discharging of electricity. The equivalent circuit model is described by configurational information indicating the circuit configuration, values of respective elements constituting an equivalent circuit model, and the like. The memory unit 22 stores the configurational information indicating a circuit configuration of such an equivalent circuit model, values of the respective elements constituting the equivalent circuit model, and the like.

The computer program (computer program product) stored in the memory unit 22 may be provided as a non-transitory recording medium M in which the computer program is readably recorded. The recording medium M is a portable memory such as a CD-ROM, a USB memory, or a secure digital (SD) card or the like. The control unit 21 reads a desired a computer program from the recording medium M using a reading device not illustrated in the drawing, and makes the memory unit 22 store the read computer program. Alternatively, the above-mentioned computer program may be provided via communication. The determination program 221 can be deployed such that the determination program 221 is executed on a single computer or on a plurality of computers that are located at one site or are distributed across a plurality of sites and are interconnected with each other by a communication network.

The voltage measurement unit 23 is connected to both ends of each energy storage device 3 via a voltage detection line. The voltage measurement unit 23 measures a voltage value of each energy storage device 3 at predetermined time intervals to acquire the voltage of each energy storage device 3 and a total voltage of the assembled battery 30. The control unit 21 acquires the voltage values through the voltage measurement unit 23.

The input unit 24 includes an interface for connecting various sensors 7 including, for example, a current sensor, a temperature sensor, and the like. The input unit 24 receives a signal relating to a current that a current sensor measures at a predetermined time interval, a signal relating to a temperature of the energy storage device 3 or a temperature of the energy storage apparatus 1 measured by the temperature sensor, and the like. The control unit 21 acquires a current value and temperature data through the input unit 24.

The output unit 25 includes a communication interface that makes the energy storage apparatus 1 communicate with the vehicle ECU. In a case where the control unit 21 acquires the determination result of whether or not supply of electricity to the energy storage apparatus 1 is possible, the control unit 21 outputs information relating to the determination result from the output unit 25 to the vehicle ECU. The vehicle ECU performs various processing based on the information acquired from the determination device 2.

Alternatively, the output unit 25 may include an interface for connecting the display device to the energy storage apparatus 1. As an example of the display device, a liquid crystal display device is named. In a case where the control unit 21 acquires the determination result of whether or not supply of electricity to the energy storage apparatus 1 is possible, the control unit 21 outputs information relating to the determination result from the output unit 25 to the display device. The display device displays the determination result based on the information outputted from the output unit 25.

The output unit 25 may include a communication interface that makes the energy storage apparatus 1 communicate with an external device. The external device that is communicably connected to the output unit 25 is a terminal device such as a personal computer or a smartphone that is used by a user, an administrator, or the like. In a case where the control unit 21 acquires the determination result of whether or not supply of electricity to the energy storage apparatus 1 is possible, the control unit 21 outputs information relating to the determination result from the output unit 25 to the terminal device. The terminal device receives the information transmitted from the output unit 25, and displays the estimation result on a display of the own device based on the received information. The determination device 2 may include, to notify the determination result of whether or not the supply of electricity to the energy storage apparatus 1 is possible to a user, a notification unit such as an LED lamp or a buzzer.

FIG. 1 illustrates an example where the determination device 2 is a BMS. Alternatively, the determination device 2 may be disposed at a place away from the energy storage apparatus 1. The determination device 2 may include a server device that is communicably connected with the BMS and the ECU at a place away from the energy storage device 3. The place where the determination of whether or not the supply of electricity is possible is not limited, and the determination may be performed in the server device or in the ECU, for example.

FIG. 1 illustrates, as the energy storage apparatus 1, an in-vehicle low-voltage power source that includes the energy storage devices 3 that are lithium ion secondary batteries. The energy storage devices 3 may be other secondary batteries or electrochemical cells having a polarization characteristic.

Figure 2:
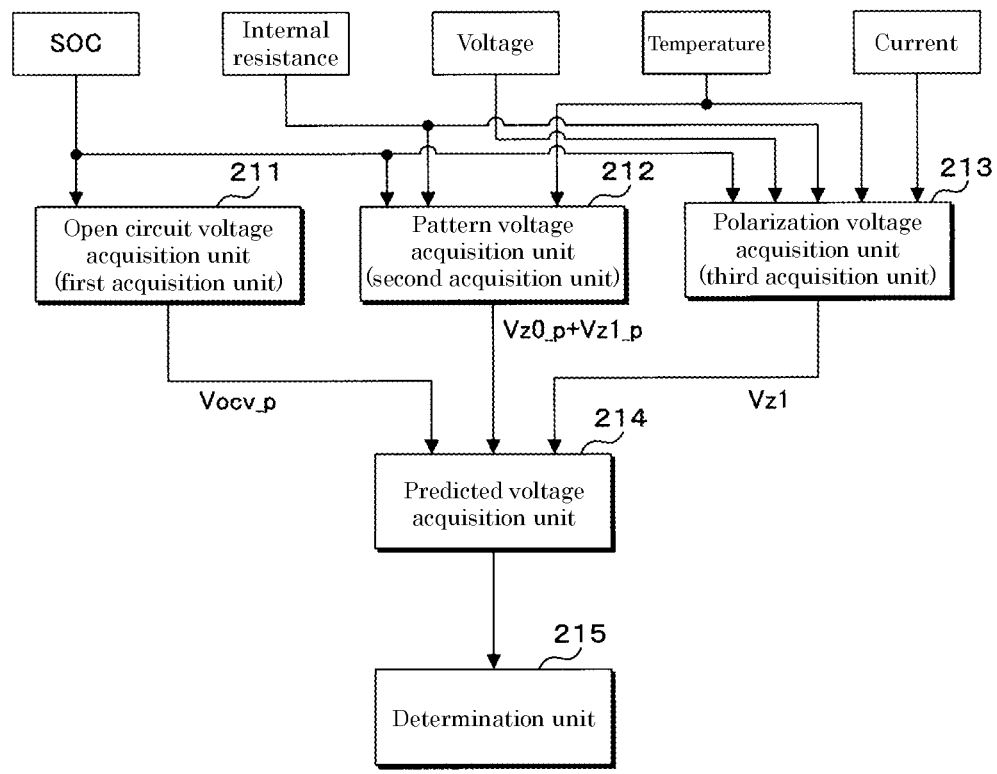
FIG. 2 is a functional block diagram illustrating the configurational example of the determination device.

FIG. 2 is a functional block diagram illustrating a configurational example of the determination device 2. The control unit 21 of the determination device 2 functions, by reading and executing the determination program 221 stored in the memory unit 22, as an open circuit voltage acquisition unit (first acquisition unit) 211, a pattern voltage acquisition unit (second acquisition unit) 212, a polarization voltage acquisition unit (third acquisition unit) 213, a predicted voltage acquisition unit 214, and a determination unit 215.

Figure 3:
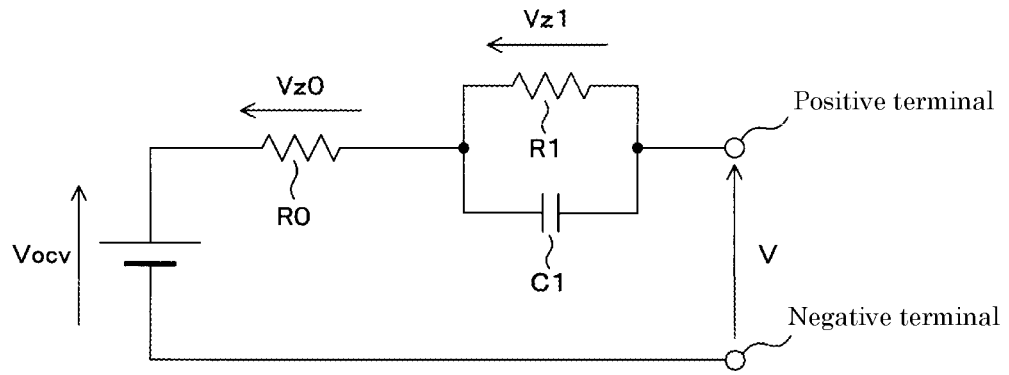
FIG. 3 is a circuit diagram illustrating an example of an equivalent circuit model of the energy storage apparatus during discharging.
Figure 4:
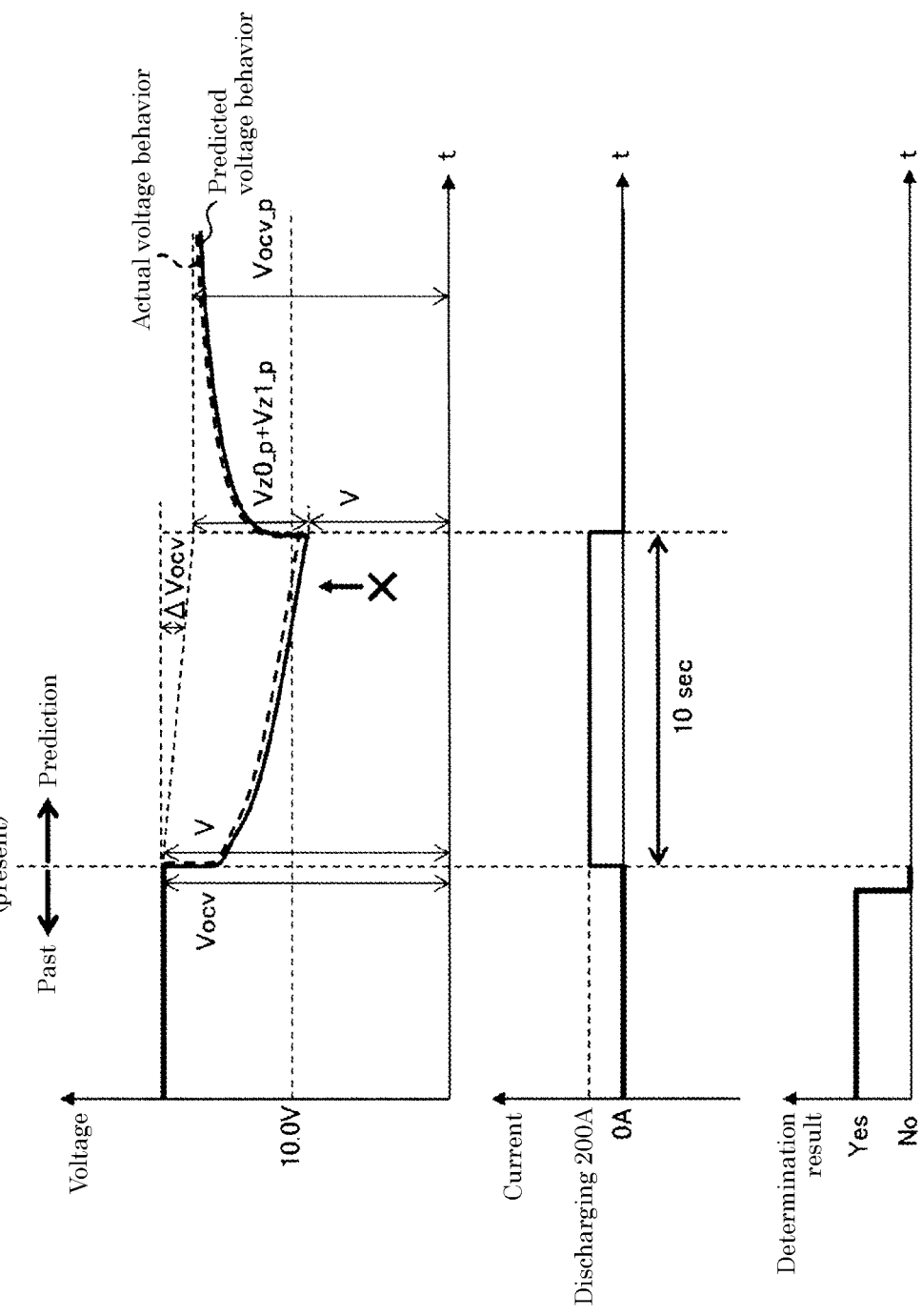
FIG. 4 is an explanatory view for describing a determination method relating to an assumed electricity supply pattern of an energy storage device having no electricity supply history in a case where the assumed electricity supply pattern is discharging.
Figure 5:
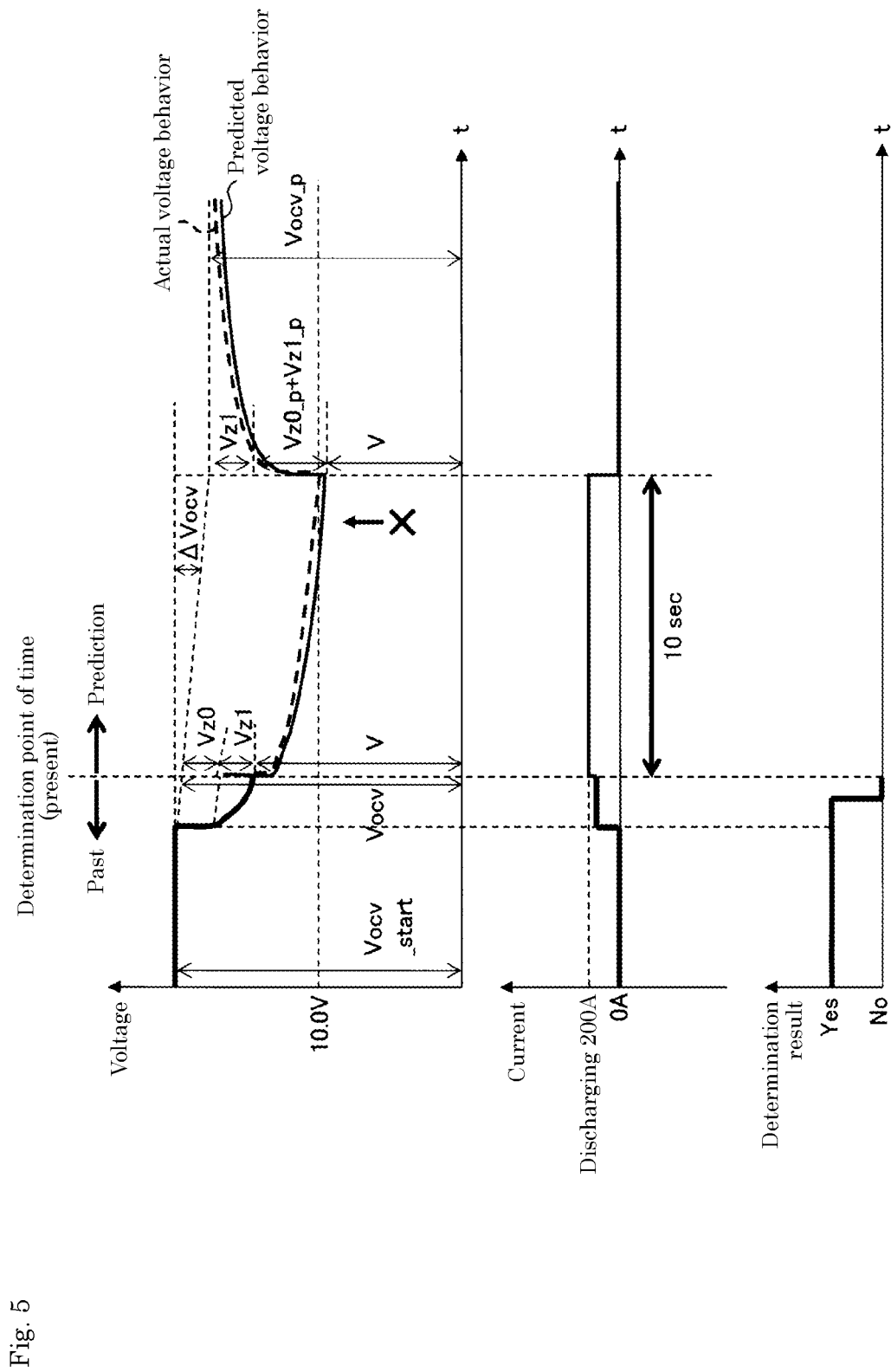
FIG. 5 is an explanatory view for describing a determination method relating to the assumed electricity supply pattern of an energy storage apparatus having charging-discharging history in a case where the assumed electricity supply pattern is discharging.

FIG. 3 is a circuit diagram illustrating an example of an equivalent circuit model of the energy storage apparatus 1 during discharging. FIG. 4 is an explanatory view for describing a determination method according to an assumed electricity supply pattern of the energy storage apparatus 1 having no electricity supply history in a case where the assumed electricity supply pattern is discharging. FIG. 5 is an explanatory view for describing a determination method according to an assumed electricity supply pattern of the energy storage apparatus 1 having charging-discharging history in a case where the assumed electricity supply pattern is discharging. Among graphs illustrated in FIG. 4 and FIG. 5, the graph on an upper side indicates a change in a voltage value of the energy storage apparatus 1 with time brought about by the supply of electricity, the graph at the center indicates a change in a current value of the energy storage apparatus 1 with time brought about by the supply of electricity, and the graph on a lower side indicates a change in the determination result of whether or not the supply of electricity is possible with time. The determination method of whether the supply of electricity is possible in this embodiment is described with reference to FIG. 2 to FIG. 5, and functions of respective functional parts of the control unit 21 are described with reference to FIG. 2 to FIG. 5.

The equivalent circuit model is the combination of the voltage source and circuit elements such as a resistor and a capacitor of the energy storage apparatus 1, and simulates the charging-discharging behavior of the energy storage apparatus 1. The equivalent circuit model illustrated in FIG. 3 as an example is a model when the lithium ion battery is used as the energy storage apparatus 1. The equivalent circuit model includes: a constant voltage source that is connected in series between a positive terminal and a negative terminal; a direct current resistor provided for simulating a direct current resistor component; and an RC parallel circuit provided for simulating a transient polarization characteristic.

The constant voltage source is a voltage source that outputs a direct current voltage. The voltage that is outputted from the constant voltage source is an open circuit voltage (OCV) of the energy storage apparatus 1, and is expressed as Vocv. The open circuit voltage Vocv is given, for example, as a function of the SOC. The open circuit voltage Vocv may be given as a function of an actual capacity of the energy storage apparatus 1.

The direct current resistor is provided for simulating a direct current resistance component (direct current impedance) of the energy storage apparatus 1, and includes a resistance element R0. The resistance element R0 is given as a value that changes corresponding to a current to be supplied, a voltage, an SOC, a temperature, and the like. Once an impedance of the direct current resistor is determined, a voltage generated in the direct current resistor when a current I flows through the equivalent circuit model can be calculated. A voltage generated in the direct current resistor is assumed as a direct-current resistance voltage Vz0.

The RC parallel circuit is formed of a resistance element R1 and a capacitive element C1 that are connected in parallel to each other. The resistance element R1 and the capacitive element C1 that form the RC parallel circuit are given as values that change corresponding to the SOC, the temperature, and the like of the energy storage apparatus 1. The impedance of the RC parallel circuit is determined based on the resistance element R1 and the capacitive element C1. Once the impedance of the RC parallel circuit is determined, when a current I flows through the equivalent circuit model, a voltage generated in the RC parallel circuit can be calculated. A voltage generated in the RC parallel circuit is assumed as a polarization voltage Vz1.

In the above-mentioned equivalent circuit model, a terminal voltage V generated at the time of discharging can be expressed by the following formulas (1) and (2) using the direct-current resistance voltage Vz0, the polarization voltage Vz1, and the open circuit voltage Vocv.

$$V = Vocv - (Vz0 + Vz1) \qquad (1)$$

$$Vocv = Vocv\_start - \Delta Vocv \qquad (2)$$

In these formulas, Vocv_start is the open circuit voltage Vocv before the discharging is started (before the simulation is started), and ΔVocv is an amount of change in the open circuit voltage Vocv from a point of time that the discharging is started to a point of time that the simulation is started. The direct-current resistance voltage Vz0 and the polarization voltage Vz1 take positive values in the discharging direction (the direction directed from the positive terminal to the negative terminal).

The resistance element R0, the resistance element R1, and the capacitive element C1 (Hereinafter, also referred to as circuit parameters) that form the equivalent circuit model described above are obtained by a known method. The circuit parameters can be set, for example, based on electricity supply pattern measurement data obtained in a battery test in consideration of the relationship between the temperature, SOC, and the like. The determination device 2 stores the circuit parameters obtained as described above, the temperature, the SOC and the like in the determination data 222 in a state where the circuit parameters and the temperature, the SOC and the like are associated with each other.

With the use of the equivalent circuit model illustrated in FIG. 3, it is possible to predict the behavior of a voltage when electricity is supplied to the energy storage apparatus 1 in accordance with an assumed electricity supply pattern in a case where the energy storage apparatus 1 has no charging-discharging history as illustrated in FIG. 4. The case where the energy storage apparatus 1 has no charging-discharging history means a case where a charge-discharge current (electricity supply current) does not flow to the energy storage apparatus 1 before electricity is supplied in accordance with an assumed electricity supply pattern. The case where the energy storage apparatus 1 has no charging-discharging history may include a case where an amount of current that flows to the energy storage apparatus 1 before electricity is supplied in accordance with the assumed electricity supply pattern is equal to or below a threshold, and a case where an amount of current that flows to the energy storage apparatus 1 is small almost at a level of dark current. As illustrated in FIG. 4, assuming a case where electricity is supplied in accordance with an assumed electricity supply pattern (a period of 10 seconds at a discharge current of 200 A in the example illustrated in FIG. 4) from a state where a charge-discharge current does not flow to the energy storage apparatus 1, a current value of a current that flows to the energy storage apparatus 1 changes from 0 A before electricity is supplied at a point of time of determination (a present point of time that determination processing is performed) to 200 A, and changes to 0 A again at a point of time after a lapse of a predetermined electricity supply time (a point of time after electricity is supplied). A terminal voltage V in the energy storage apparatus 1 is lowered along with discharging from an OCV voltage before electricity is supplied (the supply of electricity in accordance in accordance with the assumed electricity supply pattern). A terminal voltage V_p at the point of time that comes after electricity is supplied in accordance with the assumed electricity supply pattern can be calculated by subtracting a voltage change value Vz0_p+Vz1_p from an open circuit voltage Vocv_p at the point of time that comes after the electricity is supplied in accordance with the assumed electricity supply pattern using the above-mentioned formulas (1), (2).

The terminal voltage V_p obtained by the above-described processing is a predicted value in a case where the energy storage apparatus 1 has no charging-discharging history before electricity is supplied in accordance with an assumed electricity supply pattern. In a state where the vehicle is actually being used, it is necessary to simulate the voltage behavior in a case where the energy storage apparatus 1 has a charging-discharging history. The case where there is a charging-discharging history means a case where a charge-discharge current continues to flow to the energy storage apparatus 1 during the operation, that is, a case where a charge-discharge current flows to the energy storage apparatus 1 before electricity is supplied in accordance with an assumed electricity supply pattern. In a case where the energy storage apparatus 1 has a charging-discharging history as illustrated in FIG. 5, at the point of time of determination, a current value of a current that flows to the energy storage apparatus 1 is increased from 0 A at an initial stage to a current value attributed to the charging-discharging history before electricity is supplied. In a case where the supply of electricity in an assumed electricity supply pattern is predicted, the current value is changed to 200 A at the point of time of determination, and is changed to 0 A again at a point of time after electricity is supplied. A terminal voltage V in the energy storage apparatus 1 is lowered from an OCV voltage at an initial stage attributed to the charging-discharging history before electricity is supplied and, then, is further lowered from the point of time of determination point attributed to discharging in accordance in accordance with the assumed electricity supply pattern.

In a case where the energy storage apparatus 1 has the charging-discharging history, a polarization voltage Vz1 is changed corresponding to an amount of charge accumulated in or released from the capacitive element C1 of the RC parallel circuit in the equivalent circuit model. In order to reflect this change, in the above formula (1), it is necessary to successively calculate the polarization voltage Vz1 and hence, and an arithmetic operation load is increased. In the present embodiment, the polarization voltage Vz1 corresponding to the charging-discharging history is calculated by a simple method based on a measured value of a voltage of the energy storage apparatus 1 at the point of time of determination. By adding the calculated polarization voltage Vz1 as an offset to a predicted voltage value having no charging-discharging history in the equivalent circuit model, a voltage value that takes into account the charging-discharging history is efficiently estimated. Hereinafter, a method for estimating a voltage value and a method for determining whether or not the supply of electricity is possible based on the voltage value in the present embodiment will be described in detail.

In FIG. 2, the open circuit voltage acquisition unit 211 acquires an open circuit voltage Vocv_p after electricity is supplied in an assumed electricity supply pattern in a case where the energy storage apparatus 1 has no charging-discharging history. An open circuit voltage Vocv_p is obtained by subtracting a change amount ΔVocv of an open circuit voltage in an assumed electricity supply pattern from the open circuit voltage Vocv at the point of time of determination. The point of time of determination is a present point of time at which the determination processing is performed, and is a point of time before electricity is supplied in accordance with the assumed electricity supply pattern.

The open circuit voltage acquisition unit 211 stores in advance the relationship between the SOC and ΔVocv of the energy storage apparatus 1 corresponding to the assumed electricity supply pattern, which is obtained based on actual measurement data obtained in the battery test or the like. Based on the SOC of the energy storage apparatus 1 at the point of time of determination, the open circuit voltage acquisition unit 211 specifies the open circuit voltage Vocv corresponding to the SOC at the point of time of determination and ΔVocv in accordance with the assumed electricity supply pattern. The open circuit voltage Vocv at the point of time of determination can be specified based on a SOC-OCV curve stored in advance using the SOC at the point of time of determination. The open circuit voltage acquisition unit 211 calculates an open circuit voltage Vocv_p after the supply of electricity in accordance with an assumed electricity supply pattern by subtracting a change amount ΔVocv from a specified open circuit voltage Vocv. The obtained open circuit voltage Vocv_p is outputted to the predicted voltage acquisition unit 214.

To take into consider the deterioration of the energy storage apparatus 1 with time, the open circuit voltage acquisition unit 211 may acquire an actual capacity (full charge capacity) of the energy storage apparatus 1 at the point of time of determination, and may calculate the open circuit voltage Vocv_p based on the SOC (relative SOC) at the time of determination by taking into account the acquired actual capacity of the energy storage apparatus 1. By using the relative SOC, the estimation accuracy can be enhanced as compared with the case of using the SOC calculated based on the initial actual capacity of the energy storage apparatus 1 (absolute SOC).

The pattern voltage acquisition unit 212 acquires a change in voltage attributed to an assumed electricity supply pattern when the energy storage apparatus 1 has no charging-discharging history. A change in voltage attributed to an assumed electricity supply pattern is a total value of a direct-current resistance voltage Vz0_p and a polarization voltage Vz1_p after electricity is supplied in accordance with an assumed electricity supply pattern in a case where an equivalent circuit model is used. In the above-mentioned configuration, the direct-current resistance voltage Vz0_p corresponds to a first change in voltage due to an ohmic internal resistance of the energy storage apparatus 1. The polarization voltage Vz1_p corresponds to a second change in voltage due to a non-ohmic internal resistance of the energy storage apparatus 1. At the time of discharging, a change in voltage caused in an assumed electricity supply pattern is a drop voltage value.

The pattern voltage acquisition unit 212 acquires a voltage change value Vz0_p+Vz1_p after electricity is supplied in accordance with an assumed electricity supply pattern using an internal resistance determined based on a temperature and an SOC of the energy storage apparatus 1 at the point of time of determination and a current value in accordance with an assumed electricity supply pattern. The internal resistance (circuit parameter) includes a resistance element R0, a resistance element R1, and a capacitive element C1. When the assumed electricity supply pattern is discharging, a voltage change value is a voltage drop value. As the internal resistance, an initial value of the internal resistance set based on actual measurement data may be used. However, it is preferable to use a value obtained by adding a margin to the initial value by taking into account the deterioration of the energy storage apparatus 1 with time. The obtained voltage change value Vz0_p+Vz1_p is outputted to the predicted voltage acquisition unit 214.

The polarization voltage acquisition unit 213 acquires a polarization voltage Vz1 attributed to the charging-discharging history before energy is supplied in accordance with the assumed electricity supply pattern using the equivalent circuit model. The polarization voltage acquisition unit 213 calculates the polarization voltage Vz1 at a point of time of determination by subtracting a direct-current resistance voltage Vz0 from a value obtained by subtracting a terminal voltage V from an open circuit voltage Vocv based on a terminal voltage V, an open circuit voltage Vocv, and a direct-current resistance voltage Vz0 at the point of time of determination. In this processing, the polarization voltage Vz1 corresponds to a change in voltage attributed to a charging-discharging history before the supply of electricity in accordance with the assumed electricity supply pattern. A differential between an open circuit voltage Vocv and a terminal voltage V corresponds to a polarization component of the energy storage apparatus 1. The direct-current resistance voltage Vz0 corresponds to an ohmic internal resistance of the energy storage apparatus 1. At the time of discharging electricity, the polarization voltage Vz1 takes a drop voltage value.

As the terminal voltage V at a point of time of determination, measurement data of a voltage value of the energy storage apparatus 1 at the point of time of determination can be used. The open circuit voltage Vocv at a point of time of determination can be obtained based on a SOC-OCV curve stored in advance using the SOC and the temperature at the point of time of determination. In this case, to take into account the deterioration of the energy storage apparatus 1 with time, it is preferable to use the relative SOC in consideration of an actual capacity of the energy storage apparatus 1 at the point of time of determination. The direct-current resistance voltage Vz0 at the point of time of determination is obtained by multiplying the measurement data of the current value of the energy storage apparatus 1 at the point of time of determination by a value of the resistance element R0 stored in advance in the determination data 222. The obtained polarization voltage Vz1 is outputted to the predicted voltage acquisition unit 214.

The predicted voltage acquisition unit 214 acquires the voltage value V_p after the supply of electricity in accordance with the assumed electricity supply pattern based on the open circuit voltage Vocv_p after the supply of electricity in accordance with the assumed electricity supply pattern, a voltage change value_Vz0_p+Vz1_p attributed to the assumed electricity supply pattern, and a polarization voltage Vz1 attributed to the charging-discharging history before the electricity is supplied in accordance with the assumed electricity supply pattern. Based on the open circuit voltage Vocv_p and the voltage change value Vz0_p+Vz1_p, the predicted voltage acquisition unit 214 calculates the voltage value V_p by the above formula (1) using an equivalent circuit model. The predicted voltage acquisition unit 214 predicts a final voltage value V_p that takes into account the charging-discharging history by subtracting the polarization voltage Vz1 as an offset from the calculated voltage value V_p. The predicted voltage acquisition unit 214 outputs the voltage value V_p in the energy storage apparatus 1 after the supply of electricity in the acquired assumed electricity supply pattern to the determination unit 215.

The predicted voltage acquisition unit 214 may, at the time of discharging electricity from the energy storage apparatus 1, set an offset condition of the polarization voltage Vz1 to a polarization voltage Vz1≥0. In a case where the polarization voltage Vz1 is a component in the charging direction (Vz1<0), the accumulation of a charge in the capacitive element C1 is eliminated by the flow of a discharge current. Accordingly, it is not necessary to take into account the polarization voltage Vz1.

The predicted voltage acquisition unit 214 preferably attenuates the polarization voltage Vz1 that is added as an offset based on an attenuation rate α(0≤α≤1) stored in advance. The influence of the polarization voltage Vz1 at a point of time of determination after electricity is supplied (after the lapse of a predetermined time) becomes smaller as the elapsed time is prolonged. Accordingly, by adding a value obtained by multiplying the polarization voltage Vz1 by the attenuation rate α as an offset, the estimation accuracy of the more final voltage value V_p can be enhanced.

The determination unit 215 determines whether or not the supply of electricity is possible in accordance in accordance with the assumed electricity supply pattern based on a predetermined threshold and a voltage value V_p predicted by the predicted voltage acquisition unit 214. The predetermined threshold may be, for example, a lower limit value (for example, 10V) of a voltage value relating to an automatic driving operation. In a case where the obtained voltage value V_p does not fall below the threshold, the determination unit 215 determines that the supply of electricity is possible in accordance in accordance with the assumed electricity supply pattern (the continuation of the automatic drive operation). In a case where the obtained voltage value V_p falls below the threshold, the determination unit 215 determines that it is not possible to supply electricity in accordance in accordance with the assumed electricity supply pattern. Determination unit 215 outputs information based on the determination result from the output unit 25 to the vehicle ECU.

When the vehicle ECU acquires the determination result that the automatic driving operation can be continued, the vehicle ECU continues the automatic driving. When the vehicle ECU acquires the determination result that the continuation of the automatic driving operation is not possible, the vehicle ECU outputs a signal to other vehicle ECUs and/or in-vehicle devices, and the automobile is immediately shifted to a degraded operation. The determination device 2 can efficiently determine whether or not the supply of electricity is possible by a simple calculation method. Accordingly, the determination device 2 can promptly output the determination result to the vehicle.

Figure 6:
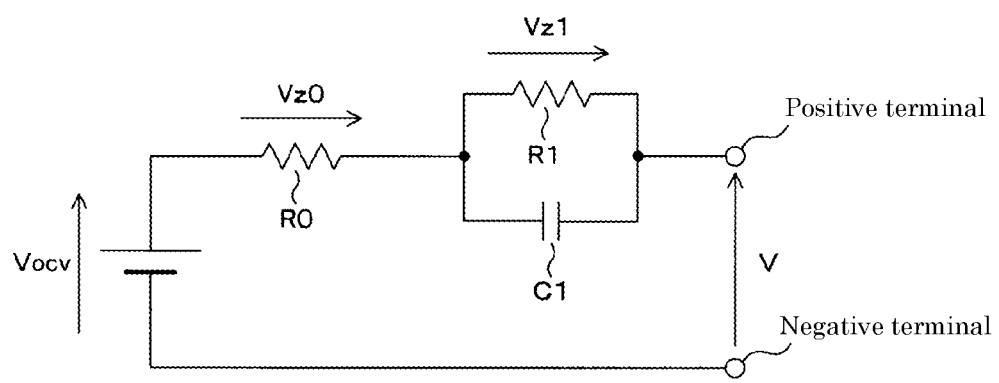
FIG. 6 is a circuit diagram illustrating an example of an equivalent circuit model of the energy storage apparatus at the time of charging.
Figure 7:
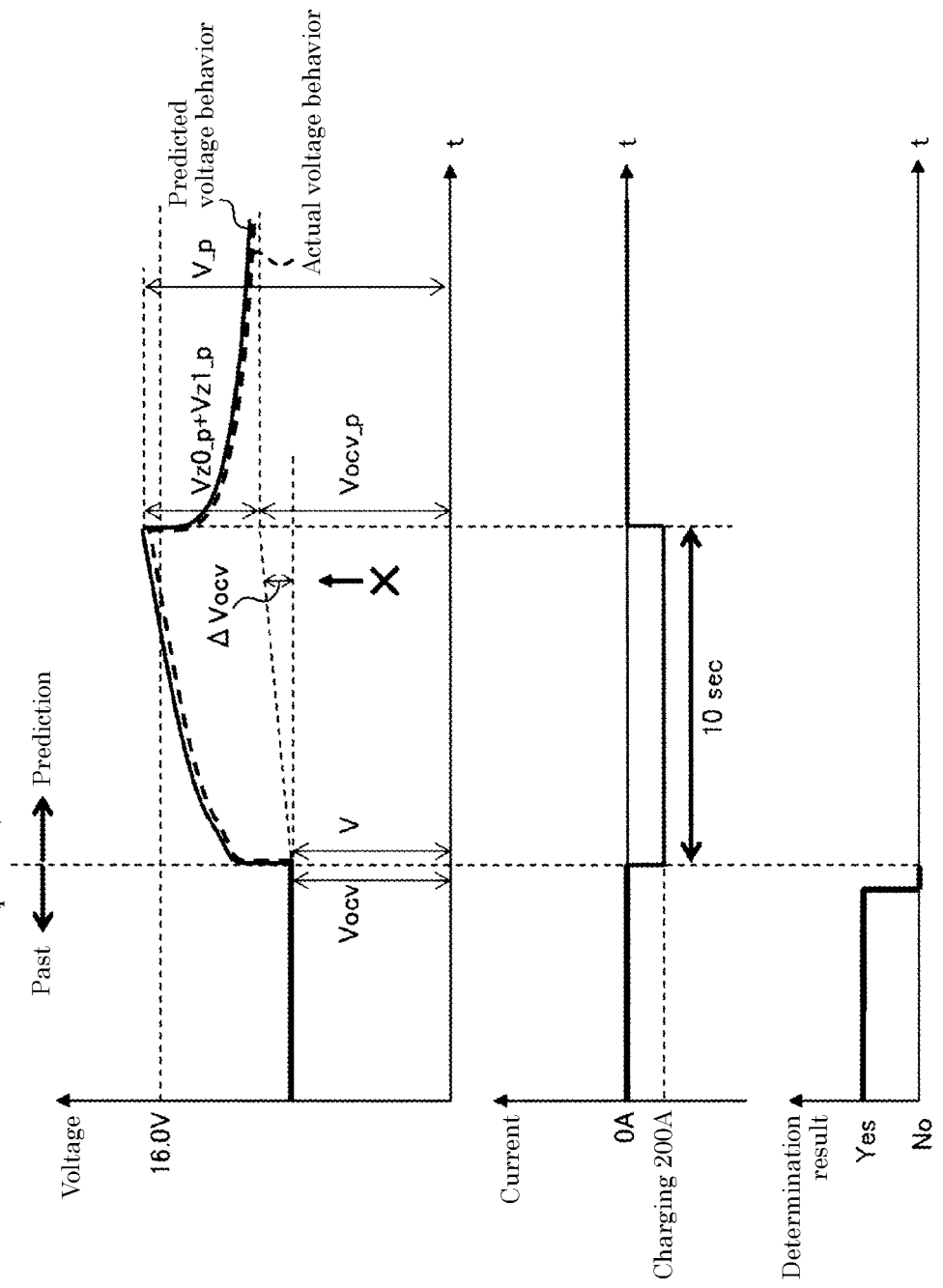
FIG. 7 is an explanatory view for describing a determination method relating to an assumed electricity supply pattern of an energy storage device having no electricity supply history in a case where the assumed electricity supply pattern is charging.
Figure 8:
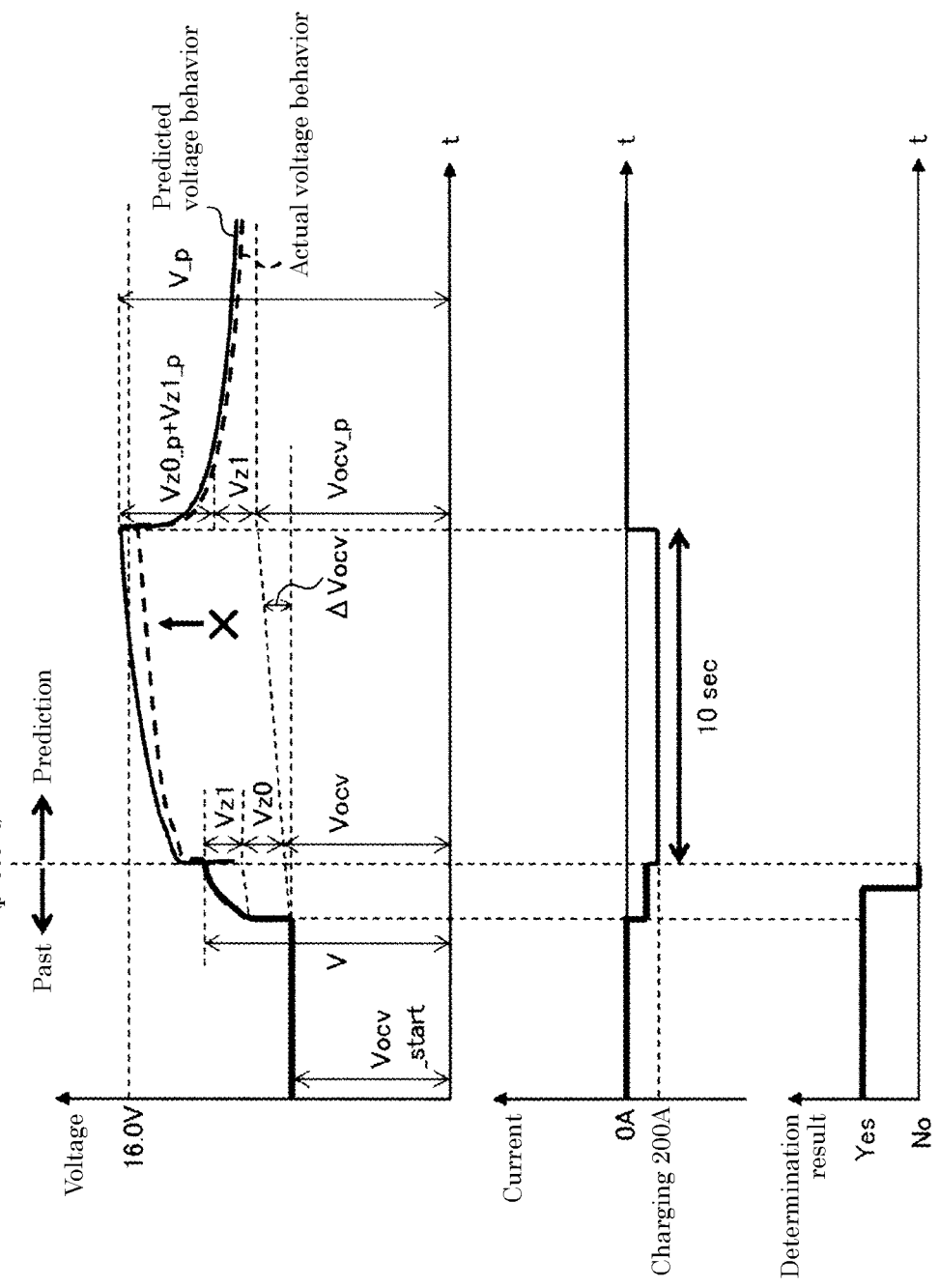
FIG. 8 is an explanatory view for describing a determination method relating to an assumed electricity supply pattern of an energy storage apparatus having charging-discharging history in a case where the assumed electricity supply pattern is charging.

The example where the assumed electricity supply pattern is discharging has been described heretofore. Also in a case where the assumed electricity supply pattern is charging, the determination device 2 performs, in the substantially same manner, the determination processing of whether or not the supply of electricity is possible. FIG. 6 is a circuit diagram illustrating an example of an equivalent circuit model of the energy storage apparatus 1 during charging. FIG. 7 is an explanatory view for describing a determination method according to an electricity supply pattern of the energy storage apparatus 1 that has no electricity supply history in a case where the assumed electricity supply pattern is charging. FIG. 8 is an explanatory view for describing a determination method according to an assumed electricity supply pattern of the energy storage apparatus 1 having charging-discharging history in a case where the assumed electricity supply pattern is charging. Among graphs illustrated in FIG. 6 and FIG. 7, the graph on an upper side indicates a change in a voltage value of the energy storage apparatus 1 with time brought about by the supply of electricity, the graph at the center indicates a change in a current value of the energy storage apparatus 1 with time brought about by the supply of electricity, and the graph on a lower side indicates a change in the determination result of whether or not the supply of electricity is possible with time.

In the equivalent circuit model illustrated in FIG. 6, a terminal voltage V generated at the time of charging can be expressed by the following formulas (3) and (4) using the direct-current resistance voltage Vz0, the polarization voltage Vz1, and the open circuit voltage Vocv.

$$V = Vocv|(Vz0|Vz1) \quad (3)$$

$$Vocv = Vocv\_start + \Delta Vocv \quad (4)$$

In these formulas, Vocv_start is the open circuit voltage Vocv before the discharging is started (before the simulation is started), and ΔVocv is an amount of change in the open circuit voltage Vocv from a point of time that the discharging is started to a point of time that the simulation is started. The direct-current resistance voltage Vz0 and the polarization voltage Vz1 take positive values in the charging direction (the direction directed from the negative terminal to the positive terminal).

With the use of the equivalent circuit model illustrated in FIG. 6, it is possible to predict the behavior of a voltage when electricity is supplied to the energy storage apparatus 1 in accordance with an assumed electricity supply pattern in a case where the energy storage apparatus 1 has no charging-discharging history as illustrated in FIG. 7. As illustrated in FIG. 7, in a case where electricity is supplied in accordance with an assumed electricity supply pattern (a period of 10 seconds at a charge current of 200 A in the example illustrated in FIG. 7) from a state where a charge-discharge current does not flow to the energy storage apparatus 1, a current value of a current that flows to the energy storage apparatus 1 changes from 0 A before electricity is supplied at a point of time of determination (a present point of time that determination processing is performed) to 200 A, and changes to 0 A again at a point of time after a lapse of a predetermined electricity supply time (a point of time after electricity is supplied). A terminal voltage V in the energy storage apparatus 1 is lowered along with discharging from an OCV voltage before electricity is supplied (the supply of electricity in accordance in accordance with the assumed electricity supply pattern). A terminal voltage V_p at the point of time that comes after electricity is supplied in accordance with the assumed electricity supply pattern can be calculated by adding a voltage change value Vz0_p+Vz1_p to an open circuit voltage Vocv_p at the point of time that comes after the electricity is supplied in accordance with the assumed electricity supply pattern using the above-mentioned formulas (3), (4).

In a case where the energy storage apparatus 1 has a charging-discharging history as illustrated in FIG. 8, at the point of time of determination, a current value of a current that flows to the energy storage apparatus 1 is decreased from 0 A at an initial stage to a current value attributed to the charging-discharging history before electricity is supplied. In a case where the supply of electricity in an assumed electricity supply pattern is predicted, the current value is changed to 200 A at the point of time of determination, and is changed to 0 A again at a point of time after electricity is supplied. A terminal voltage V in the energy storage apparatus 1 is increased from an OCV voltage at an initial stage attributed to the charging-discharging history before electricity is supplied and, then, is further increased from the point of time of determination point attributed to discharging in accordance in accordance with the assumed electricity supply pattern.

The determination device 2 estimates a final voltage value that takes into account the charging-discharging history by adding the polarization voltage Vz1 calculated based on the measurement value of the voltage at the point of time of determination time, as an offset, to the predicted voltage value having no charging-discharging history in accordance with the equivalent circuit model by substantially the same method as in the case where electricity is supplied in accordance with the assumed electricity supply pattern described above.

In a case where the assumed electricity supply pattern is charging, the pattern voltage acquisition unit 212 acquires a voltage change value Vz0_p+Vz1_p attributed to the assumed electricity supply pattern when the energy storage apparatus 1 has no charging-discharging history. At the time of discharging, a change in voltage attributed to an assumed electricity supply pattern is a rising voltage value.

The polarization voltage acquisition unit 213 calculates the polarization voltage Vz1 at a point of time of determination by subtracting a direct-current resistance voltage Vz0 from a value obtained by subtracting an open circuit voltage Vocv from a terminal voltage V based on a terminal voltage V, an open circuit voltage Vocv, and a direct-current resistance voltage Vz0 at the point of time of determination. A differential between the terminal voltage V and the open circuit voltage Vocv corresponds to a polarization component of the energy storage apparatus 1. At the time of charging electricity, the polarization voltage Vz1 takes a rising voltage value.

Based on the open circuit voltage Vocv_p and the voltage change value Vz0_p+Vz1_p, the predicted voltage acquisition unit 214 calculates the voltage value V_p by the above formula (3) using an equivalent circuit model. The predicted voltage acquisition unit 214 predicts a final voltage value V_p that takes into account the charging-discharging history by adding the polarization voltage Vz1 as an offset to the calculated voltage value V_p.

At the time of charging electricity from the energy storage apparatus 1, an offset condition of the polarization voltage Vz1 may be set to satisfy a relationship of polarization voltage Vz1≥0 in the same manner as at the time of discharging. In a case where the polarization voltage Vz1 is a component in the discharging direction (Vz1<0) at the time of charging the energy storage apparatus 1, the accumulation of a charge in the capacitive element C1 is eliminated by the flow of a charge current. Accordingly, it is not necessary to take into account the polarization voltage Vz1. Also at the time of charging the energy storage apparatus 1, substantially in the same manner as at the time of discharging, it is preferable to attenuate the polarization voltage Vz1 added as an offset by using the attenuation rate α(0≤α≤1).

The determination unit 215 determines whether or not the supply of electricity is possible in accordance in accordance with the assumed electricity supply pattern based on a predetermined threshold and a voltage value V_p predicted by the predicted voltage acquisition unit 214. The predetermined threshold may be, for example, an upper limit value (for example, 16V) of a voltage value at which electricity is chargeable. In a case where the obtained voltage value V_p does not exceed the threshold, the determination unit 215 determines that the supply of electricity in accordance in accordance with the assumed electricity supply pattern (the reception of charging based on transient charging) is possible. In a case where the obtained voltage value V_p exceeds the threshold, the determination unit 215 determines that the supply of electricity in accordance in accordance with the assumed electricity supply pattern is not possible. Determination unit 215 outputs information based on the determination result from the output unit 25 to the vehicle ECU.

In a case where the vehicle ECU acquires the determination result that the reception of charging by the transient charging is possible, the vehicle ECU continues the charging reception by the transient charging. In a case where the vehicle ECU acquires the determination result that the reception of charging based on the reception of charging by the transient charging is not possible, the vehicle ECU outputs a signal to other vehicle ECUs and/or in-vehicle devices so that the automobile is immediately shifted to a degraded operation. According to the above processing, since the voltage value associated in accordance with the assumed electricity supply pattern can be efficiently predicted not only at the time of performing discharging but also at the time of performing charging. Accordingly, the charge-discharge current to the energy storage apparatus 1 can be suitably controlled corresponding to the predicted result.

In the above description, the example has been described where whether or not the supply of electricity is possible is determined based on the threshold relating to the voltage value. Alternatively, the threshold may be, for example, an upper limit value (for example, 100 A) at which charging of electricity is receivable. The determination device 2 predicts a current value at which charging of electricity is receivable when electricity is supplied in accordance in accordance with the assumed electricity supply pattern based on the assumed electricity supply pattern, the measurement data of the energy storage apparatus 1, and the like. The determination device 2 compares a predicted current value at which the charging of electricity is receivable with a threshold, and determines whether or not the supply of electricity is possible.

Figure 9:
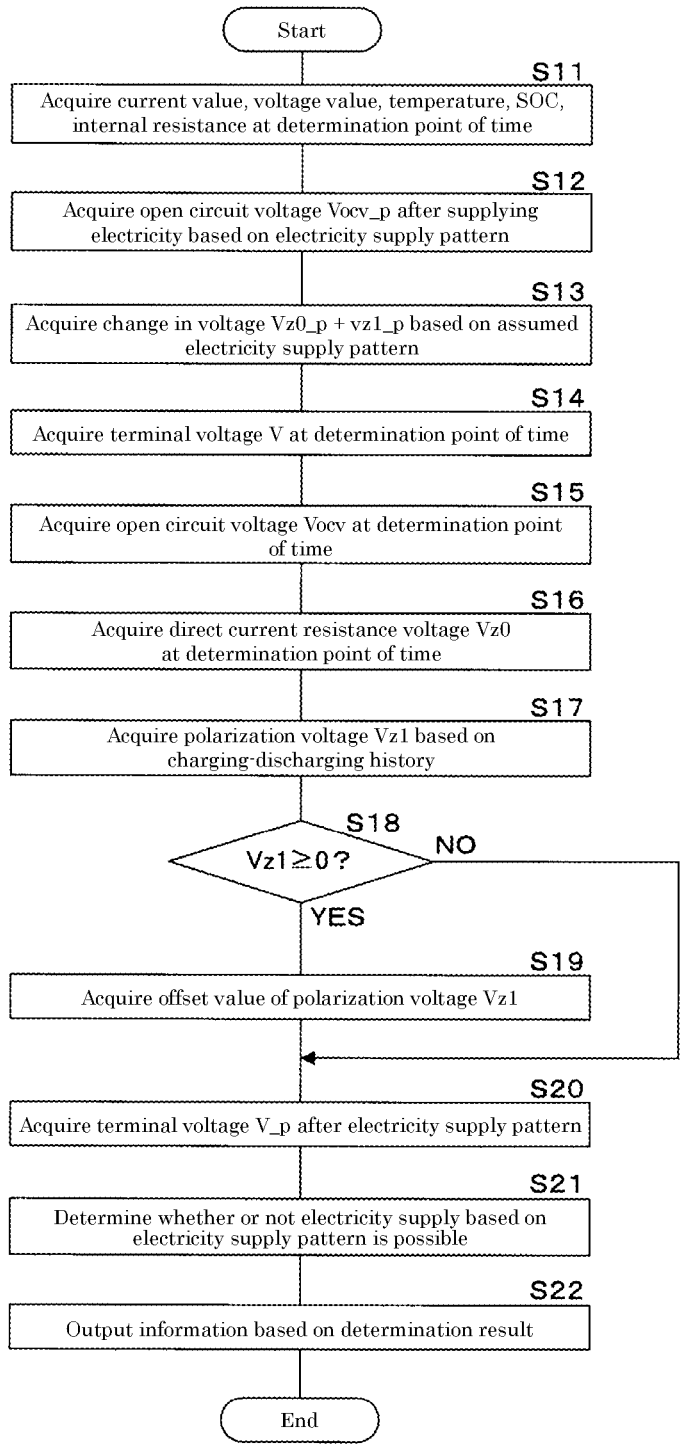
FIG. 9 is a flowchart illustrating an example of steps of determination processing.

FIG. 9 is a flowchart illustrating an example of steps of determination processing. The control unit 21 of the determination device 2 performs. for example, the following processing in accordance with the determination program 221 at predetermined time intervals during the use of the vehicle. The control unit 21 may perform the determination processing on a discharging side and processing on a charging side in a properly switchable manner in response to the direction of a current that flows in and out from the energy storage apparatus 1.

The control unit 21 of the determination device 2 acquires measurement data including a current value, a voltage value, and a temperature of the energy storage apparatus 1, and an SOC and an internal resistance corresponding to the measurement data of the energy storage apparatus 1 at a point of time of determination (a present point of time at which the determination processing is performed) through the voltage measurement unit 23 and the input unit 24 (step S11). The method of calculating the SOC is not limited. However, as an example, the control unit 21 may use a current integration method. The control unit 21 acquires an internal resistance corresponding to the SOC, the temperature and the like at the point of time of determination based on information stored in the determination data 222. In order to consider time degradation of the energy storage apparatus 1, the control unit 21 may further acquire the actual capacity of the energy storage apparatus 1 at the determination time point. The control unit 21 may acquire the SOC, the internal resistance, and the like via an external device not illustrated in the drawing.

The control unit 21 acquires an open circuit voltage Vocv_p after electricity is supplied in an assumed electricity supply pattern on a discharging side and/or a charging side in a case where the energy storage apparatus 1 has no charging-discharging history (step S12). In a case of determination processing on a discharging side, the control unit 21 calculates an open circuit voltage Vocv_p by subtracting a change amount ΔVocv of an open circuit voltage in accordance with an assumed electricity supply pattern from the open circuit voltage Vocv at the point of time of determination. In a case of determination processing on a charging side, the control unit 21 calculates an open circuit voltage Vocv_p by adding a change amount ΔVocv of an open circuit voltage in accordance with the assumed electricity supply pattern to the open circuit voltage Vocv at the point of time of determination.

The control unit 21 acquires a voltage change value Vz0_p+Vz1_p attributed to the assumed electricity supply pattern in a case where the energy storage apparatus 1 does not have charging-discharging history (step S13). The control unit 21 acquires a voltage change value Vz0_p+Vz1_p after electricity is supplied in accordance with an assumed electricity supply pattern using an internal resistance determined based on an SOC and a temperature of the energy storage apparatus 1 at the point of time of determination and a current value in accordance with the assumed electricity supply pattern.

The control unit 21 may store, in advance, an open circuit voltage Vocv_p and a voltage change value Vz0_p+Vz1_p calculated based on an assumed electricity supply pattern on a discharging side and/or a charging side, an SOC and a temperature of the energy storage apparatus 1, and the like in the determination data 222. In this case, the control unit 21 references the information stored in the determination data 222, and acquires an open circuit voltage Vocv_p and a voltage change value Vz0_p+Vz1_p corresponding to the acquired SOC, the acquired temperature and the like of the energy storage apparatus 1.

The control unit 21 acquires a terminal voltage V at the point of time of determination (step S14). The control unit 21 acquires measurement data of a voltage value of the energy storage apparatus 1 at the point of time of determination as a terminal voltage V at a point of time of determination.

The control unit 21 acquires an open circuit voltage Vocv at a point of time of determination based on an SOC and a temperature at a point of time of determination using a SOC-OCV curve stored in advance (step S15).

The control unit 21 acquires a direct-current resistance voltage Vz0 at the point of time of determination by multiplying measurement data of a current value of the energy storage apparatus 1 at the point of time of determination by a value of the resistance element R0 stored in the determination data 222 in advance (step S16).

The control unit 21 acquires a polarization voltage Vz1 attributed to the charging-discharging history before electricity is supplied associated in accordance with the assumed electricity supply pattern on a discharging side and/or a charging side based on a terminal voltage V, an open circuit voltage Vocv, and a direct-current resistance voltage Vz0 acquired at the point of time of determination (step S17). In a case of determination processing on a discharging side, the control unit 21 sets a value obtained by subtracting a terminal voltage V and a direct-current resistance voltage Vz0 from an open circuit voltage Vocv as a polarization voltage Vz1. In a case of determination processing on a charging side, the control unit 21 sets a value obtained by subtracting an open circuit voltage Vocv and a direct-current resistance voltage Vz0 from a terminal voltage V as a polarization voltage Vz1.

The control unit 21 determines whether or not the acquired polarization voltage Vz1 is 0 or more, that is, whether or not the polarization voltage Vz1 satisfies an offset condition (step S18).

In a case where the control unit 21 determines that a polarization voltage Vz1 is less than 0 (step S18: NO), the control unit 21 skips the offset processing and advances the processing to step S20.

In a case where the control unit 21 determines that the polarization voltage Vz1 is 0 or more (step S18: YES), the control unit 21 acquires an offset value obtained by applying attenuation processing to the acquired polarization voltage Vz1 (step S19). The control unit 21 acquires a value obtained by multiplying the polarization voltage Vz1 acquired in step S17 by an attenuation rate α stored in advance as an offset value of the polarization voltage Vz1. For the sake of simplifying the calculation, the processing in step S19 may be omitted.

The control unit 21 acquires a predicted value of a voltage value V_p after electricity is supplied in accordance with the assumed electricity supply pattern based on an open circuit voltage Vocv_p after electricity is supplied in accordance with the assumed electricity supply pattern, a voltage change value Vz0_p+Vz1_p attributed to the assumed electricity supply pattern, and a polarization voltage Vz1 attributed to charging-discharging history before electricity is supplied (step S20). In the case of the determination processing on a discharging side, the control unit 21 calculates a final voltage value V_p by subtracting a polarization voltage Vz1 as an offset from a voltage value V_p obtained by dividing a voltage change value Vz0_p+Vz1_p by an open circuit voltage Vocv_p. In the case of the determination processing on a charging side, the control unit 21 calculates a final voltage value V_p by adding a polarization voltage Vz1 as an offset to a voltage value V_p obtained by adding a voltage change value Vz0_p+Vz1_p to an open circuit voltage Vocv_p.

The control unit 21 determines, based on a predicted voltage value V_p, whether or not the supply of electricity in accordance with an assumed electricity supply pattern is possible (step S21). The control unit 21 determines a magnitude relationship between a predicted voltage value V_p and a predetermined threshold, and determines whether or not the predicted voltage value V_p is equal to or larger than the threshold. In the case of the determination processing on the discharging side, when the predicted voltage value V_p is equal to or larger than the threshold (for example, a lower limit value of a voltage value relating to an automatic driving operation), the control unit 21 determines that discharging in accordance with an assumed electricity supply pattern is possible. In the case of the determination processing on the charging side, when the predicted voltage value V_p is less than the threshold (for example, an upper limit value of the voltage value at which charging is receivable), the control unit 21 determines that discharging in accordance with an assumed electricity supply pattern is possible.

The control unit 21 outputs information based on the determination result from the output unit 25 to the vehicle ECU so that a series of processing is completed (step S22). The control unit 21 may return the processing to step S11 and may repeat the determination processing.

The vehicle ECU can perform processing such as shifting the operation of the energy storage apparatus 1 to a degrading operation in response to the reception of the determination result from the determination device 2.

The sequence described in the respective embodiments described above is not limited. The order of the respective processing steps may be performed by changing the order within a range in which no contradiction occurs in the contents of processing, or a plurality of processing may be performed in parallel.

The determination method, the determination device, and the program can be applied to applications other than vehicles, and may be applied to a flying body such as an aircraft, a flying vehicle, or a high altitude platform station (HAPS), or may be applied to a ship or a submarine. It is preferable that the determination method, the determination device, and the program be applied to a mobile body that are required to secure high safety (real-time calculation being required). However, the application of the determination method, the determination device, and the program is not limited to the mobile body, and the application of the determination method, the determination device, and the program may be applied to a stationary energy storage apparatus.

It should be construed that the embodiments disclosed herein are illustrative in all respects and are not limitative. The technical features described in the respective embodiments can be combined with each other, and the scope of the present invention is intended to include all modifications within the scope of the claims and the scope equivalent to the claims.

The invention claimed is:

1. A determination method of determining a charging reception performance and/or a discharging performance of an energy storage apparatus, the method comprising:
    acquiring an open circuit voltage of the energy storage apparatus after electricity is supplied in accordance with an assumed electricity supply pattern, the open circuit voltage being estimated based on a charging state of the energy storage apparatus at a point of time of determination;

acquiring a change in voltage attributed to the assumed electricity supply pattern after electricity is supplied in accordance with the assumed electricity supply pattern, the change in voltage being estimated based on an internal resistance of the energy storage apparatus and a charging state and a temperature at the point of time of determination;

acquiring a change in voltage attributed to electricity supply history before the electricity is supplied in accordance with the assumed electricity supply pattern, the change in voltage being estimated based on a polarization component of the energy storage apparatus before the electricity is supplied in accordance with the assumed electricity supply pattern; and determining whether or not it is possible to supply electricity to the energy storage apparatus in accordance with the assumed electricity supply pattern based on the acquired open circuit voltage, the change in voltage attributed to the assumed electricity supply pattern, and the change in voltage attributed to the electricity supply history.

2. The determination method according to claim 1, wherein the change in voltage attributed to the assumed electricity supply pattern includes a first change in voltage due to an ohmic internal resistance of the energy storage apparatus and a second change in voltage due to a non-ohmic internal resistance.

3. The determination method according to claim 2, wherein the change in voltage attributed to the electricity supply history is obtained by subtracting the ohmic internal resistance of the energy storage apparatus before the electricity is supplied in accordance with the assumed electricity supply pattern from a polarization component of the energy storage apparatus before the electricity is supplied in accordance with the assumed electricity supply pattern.

4. The determination method according to claim 3, wherein it is determined whether or not the supply of electricity to the energy storage apparatus in accordance with the assumed electricity supply pattern is possible based on a voltage value obtained by adding or subtracting, according to an electricity supply direction at a point of time before the electricity is supplied in accordance with the assumed electricity supply pattern, the change in voltage attributed to the electricity supply history to or from a change in voltage attributed to the open circuit voltage and the assumed electricity supply pattern.

5. The determination method according to claim 1, wherein the change in voltage attributed to the electricity supply history is obtained by subtracting the ohmic internal resistance of the energy storage apparatus before the electricity is supplied in accordance with the assumed electricity supply pattern from a polarization component of the energy storage apparatus before the electricity is supplied in accordance with the assumed electricity supply pattern.

6. The determination method according to claim 5, wherein it is determined whether or not the supply of electricity to the energy storage apparatus in accordance with the assumed electricity supply pattern is possible based on a voltage value obtained by adding or subtracting, according to an electricity supply direction at a point of time before the electricity is supplied in accordance with the assumed electricity supply pattern, the change in voltage attributed to the electricity supply history to or from a change in voltage attributed to the open circuit voltage and the assumed electricity supply pattern.

7. The determination method according to claim 1, wherein it is determined whether or not the supply of electricity to the energy storage apparatus in accordance with the assumed electricity supply pattern is possible based on a voltage value obtained by adding or subtracting, according to an electricity supply direction at a point of time before the electricity is supplied in accordance with the assumed electricity supply pattern, the change in voltage attributed to the electricity supply history to or from a change in voltage attributed to the open circuit voltage and the assumed electricity supply pattern.

8. A determination device for determining a charging reception performance and/or a discharging performance of an energy storage apparatus, the determination device comprising:

a first acquisition unit configured to acquire an open circuit voltage of the energy storage apparatus after electricity is supplied in accordance with an assumed electricity supply pattern, the open circuit voltage being estimated based on a charging state of the energy storage apparatus at a point of time of determination;

a second acquisition unit configured to acquire a change in voltage attributed to the assumed electricity supply pattern after the electricity is supplied in accordance with the assumed electricity supply pattern, the change in voltage being estimated based on an internal resistance of the energy storage apparatus and a charging state and a temperature at the point of time of determination;

a third acquisition unit configured to acquire a change in voltage attributed to electricity supply history before electricity is supplied in accordance with the assumed electricity supply pattern, the change in voltage being estimated based on a polarization component of the energy storage apparatus before the electricity is supplied in accordance with the assumed electricity supply pattern; and a determination unit configured to determine whether or not the supply of electricity to the energy storage apparatus in accordance with the assumed electricity supply pattern is possible based on the acquired open circuit voltage, the change in voltage attributed to the assumed electricity supply pattern, and the change in voltage attributed to the electricity supply history.

9. A program stored in a non-transitory storage medium that causes a computer for determining a charging reception performance and/or a discharging performance of an energy storage apparatus to execute the steps of:

acquiring an open circuit voltage of the energy storage apparatus after electricity is supplied in accordance with an assumed electricity supply pattern, the open circuit voltage being estimated based on a charging state of the energy storage apparatus at a point of time of determination;

acquiring a change in voltage attributed to the assumed electricity supply pattern after the electricity is supplied in accordance with the assumed electricity supply pattern, the change in voltage being estimated based on an internal resistance of the energy storage apparatus and a charging state and a temperature at the point of time of determination;

acquiring a change in voltage attributed to electricity supply history before electricity is supplied in accordance with the assumed electricity supply pattern, the change in voltage being estimated based on a polarization component of the energy storage apparatus before the electricity is supplied in accordance with the assumed electricity supply pattern; and determining whether or not the supply of electricity to the energy storage apparatus in accordance with the assumed electricity supply pattern is possible based on the acquired open circuit voltage, the change in voltage attributed to the assumed electricity supply pattern, and the change in voltage attributed to the electricity supply history.

* * * * *